United States Patent [19]
Lee et al.

[11] Patent Number: 5,699,306
[45] Date of Patent: Dec. 16, 1997

[54] ROW REDUNDANCY FOR NONVOLATILE SEMICONDUCTOR MEMORIES

[75] Inventors: Sung-Soo Lee; Jin-Ki Kim, both of Seoul, Rep. of Korea

[73] Assignee: Samsung Electronics Co., Ltd., Suwon, Rep. of Korea

[21] Appl. No.: 593,203

[22] Filed: Jan. 29, 1996

[30] Foreign Application Priority Data

Jan. 28, 1995 [KR] Rep. of Korea ............... 1737/1995

[51] Int. Cl.$^6$ ............................................. G11C 13/00
[52] U.S. Cl. ................... 365/200; 365/189.05; 365/210; 365/230.08
[58] Field of Search ................ 365/189.05, 200, 365/210, 230.08

[56] References Cited

U.S. PATENT DOCUMENTS 5,457,655  10/1995  Savignac et al. ............... 365/200
5,477,492  12/1995  Ohsaki et al. .................. 365/200

*Primary Examiner*—Terrell W. Fears
*Attorney, Agent, or Firm*—Cushman Darby & Cushman, IP Group of Pillsbury Madison & Sutro LLP

[57] ABSTRACT

A redundant circuit for EEPROMs which is capable of replacing defective normal memory cells with redundant memory cells in a wafer state as well as in a packaged state. The nonvolatile semiconductor memory includes an array having normal row blocks and redundant row blocks. A normal row decoder selects one of the normal row blocks, and a normal row decoder disable circuit disables the normal row decoder in response to a redundant array selection command. A redundant row block selection circuit selects one of the redundant row blocks in response to the redundant array selection command and an external address. First and second redundant latch circuits are provided for storing programmed addresses corresponding to defective normal row blocks. The second redundant latch circuit is programmed when first redundant row blocks are defective, and is capable of being programmed in a package state. Thereafter, a redundant address overlap selection prevention circuit prevents both the first and second redundant row blocks from being selected when the defective normal row block address is specified, and enables only the second redundant row block to be selected instead.

8 Claims, 8 Drawing Sheets

ROW REDUNDANCY FOR NONVOLATILE SEMICONDUCTOR MEMORIES

BACKGROUND OF THE INVENTION

1. Field of the Invention

The present invention relates to a nonvolatile semiconductor memory, and more particularly, to a row redundancy device and method for an electrically erasable, programmable read only memory (EEPROM).

2. Description of the Related Art

EEPROMs today have a trend toward high integration and miniaturization. High integration and miniaturization cause manufacturing yields to decrease due to various processing difficulties, such as difficulties in fine etching processes. Defects in memory cell arrays, which occupy a large portion of the total a semiconductor chip area, occur particularly frequently. To solve this problem, redundancy techniques are used to replace failed memory cells with spare or redundant memory cells.

Conventional EEPROMs employing widely used redundancy techniques include a redundant address latch circuit to store address signals which specify failed or defective memory cells. The latch circuit thereafter generates redundant address signals in response to the specified address signals. A normal decoder disable circuit is also included to disable a normal decoder in response to the redundant address signals. A normal memory cell array is connected to the normal decoder, and a spare or redundant memory cell array is connected to the spare or redundant decoder. Thus, when address signals are received which specify failed or defective normal memory cells, the redundant address latch circuit produces redundant address signals, thereby selecting redundant memory cells via the redundant decoder and at the same time disabling the normal decoder.

The redundant address latch circuit, which stores addresses specifying defective memory cells, is called a program circuit. There are two techniques of programming the program circuit with the redundant address. One is a laser programming technique which selectively cuts fuses using a laser beam to thereby store the redundant address. The other is an electrical programming technique which selectively cuts fuses by flowing a large current therethrough.

In the redundancy technique using laser programming, the program circuit is programmed with addresses corresponding to defective memory cells identified by tests performed in a wafer state after wafer processes are completed. This technique can be employed only in a wafer state. Thus, it has a drawback in that the repair of defective normal memory cells is impossible in a package state.

The redundancy technique using electrical programming has an advantage in that the repair of defective normal memory cells is possible after completion of packaging. However, because redundant memory cells may also become defective, there remains a need for EEPROMs which are capable of repairing defective redundant memory cells as well after the completion of wafer processing and packaging.

Prior EEPROMs have never been able to determine whether defects exist in redundant memory cells prior to the replacement of normal memory cells therewith. Therefore, the possibility of defects still remains after the replacement. Accordingly, there is a need for EEPROMS that are capable of selecting redundant memory cells and then determining the presence or absence of their defects.

Furthermore, after replacing defective normal memory cells with redundant memory cells by laser programming, any one of the replacement redundant memory cells may later develop a defect. In this case, different redundant memory cells can be used as replacements by electrically programming the same address used when first specifying the defective normal memory cells. However, subsequent reception of the specified address causes the first and second redundant memory cells to be selected at the same time, resulting in a malfunction.

SUMMARY OF THE INVENTION

It is, therefore, an object of the present invention to provide a redundant circuit for EEPROMs which is capable of replacing defective normal memory cells with redundant memory cells in a wafer state as well as in a packaged state.

It is another object of the present invention to provide a redundant circuit for EEPROMs which causes only redundant memory cells to be selected when appropriate, and further determines the presence or absence of their defects.

It is still another object of the present invention to provide a redundant circuit for EEPROMs which, after replacement of defective normal memory cells with first redundant memory cells, when any one of the first redundant memory cells fails, replaces them with second redundant memory cells without malfunction.

According to one aspect of the present invention, the present invention provides a nonvolatile semiconductor memory including an array having normal row blocks and redundant row blocks. A normal row decoder is provided to select normal row blocks in response to a specified address, and a normal row decoder disable circuit disables the normal row decoder in response to a redundant array selection command. A redundant row block selection circuit instead selects one of the redundant row blocks in response to the redundant array selection command and the specified address.

According to another aspect of the present invention, first and second redundant latch circuits are further provided for storing programmed addresses corresponding to defective normal row blocks. The second redundant latch circuit is programmed when first redundant row blocks are defective, and is capable of being programmed in a package state. Thereafter, a redundant address overlap selection prevention circuit prevents both the first and second redundant row blocks from being selected when the defective normal row block address is specified, and enables only the second redundant row block to be selected instead.

BRIEF DESCRIPTION OF THE DRAWINGS

The present invention is illustrated by way of example only and is not limited to the figures of the accompanying drawings, in which.

DETAILED DESCRIPTION OF THE PREFERRED EMBODIMENTS

In the following description, the term "memory transistor" or "memory cell" indicates a floating gate MOS FET with a source, a drain, a floating gate for storing data and a control gate. However, it will be appreciated that other types of memory cells are possible.

An EEPROM of one embodiment of the present invention is fabricated by a CMOS process technique on a silicon substrate, and includes N-channel MOS transistors of depletion modes (hereinafter referred to as "D-type transistors") with threshold voltages of about −1.8 volts, N-channel MOS transistors of enhancement modes (hereinafter referred to as "N-channel transistors") with threshold voltages of about 0.7 volts, and P-channel MOS transistors (hereinafter referred to as "P-channel transistors") with threshold voltages of about −0.9 volts.

Although the preferred embodiment of the present invention will be described for an EEPROM with NAND structured memory cells of 4 M×8 bits, it should be noted that the present invention is not limited thereto.

Figure 1:
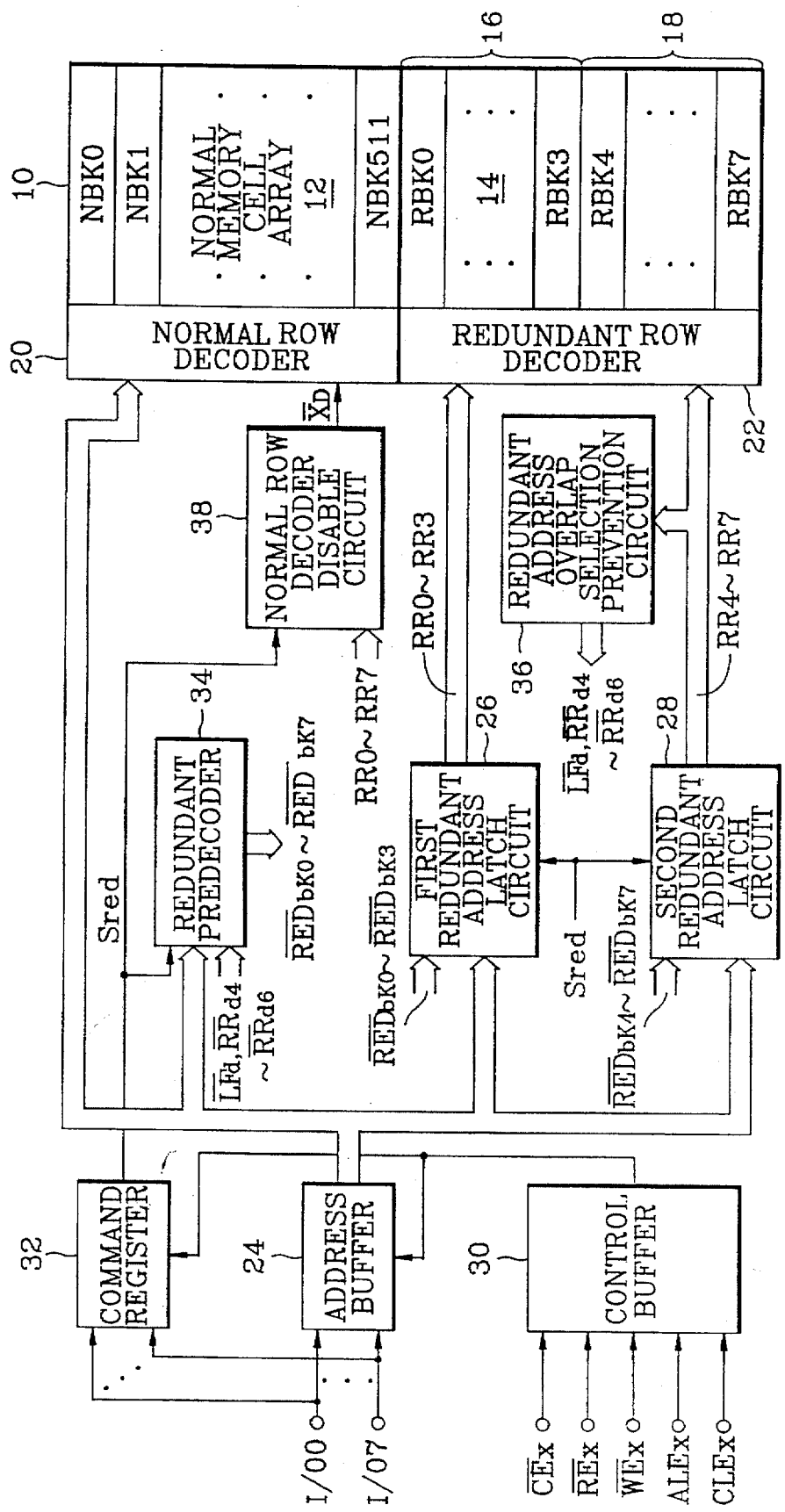
FIG. 1 is a block diagram of a row redundancy device according to the preferred embodiment of the present invention.

FIG. 1 is a schematic block diagram illustrating a row redundancy device according to a preferred embodiment of the present invention. As shown in FIG. 1, a memory cell array 10 includes a normal memory cell array 12 and a redundant memory cell array 14. The normal memory cell array 12 is comprised of 512 normal row blocks NBK0~NBK511 arranged in a row direction and 4,096 bit lines extending in a column direction. The redundant memory cell array 14 is comprised of 8 redundant row blocks RBK0~RBK7 arranged in the row direction and 4,096 bit lines extending in the column direction.

Figure 2:
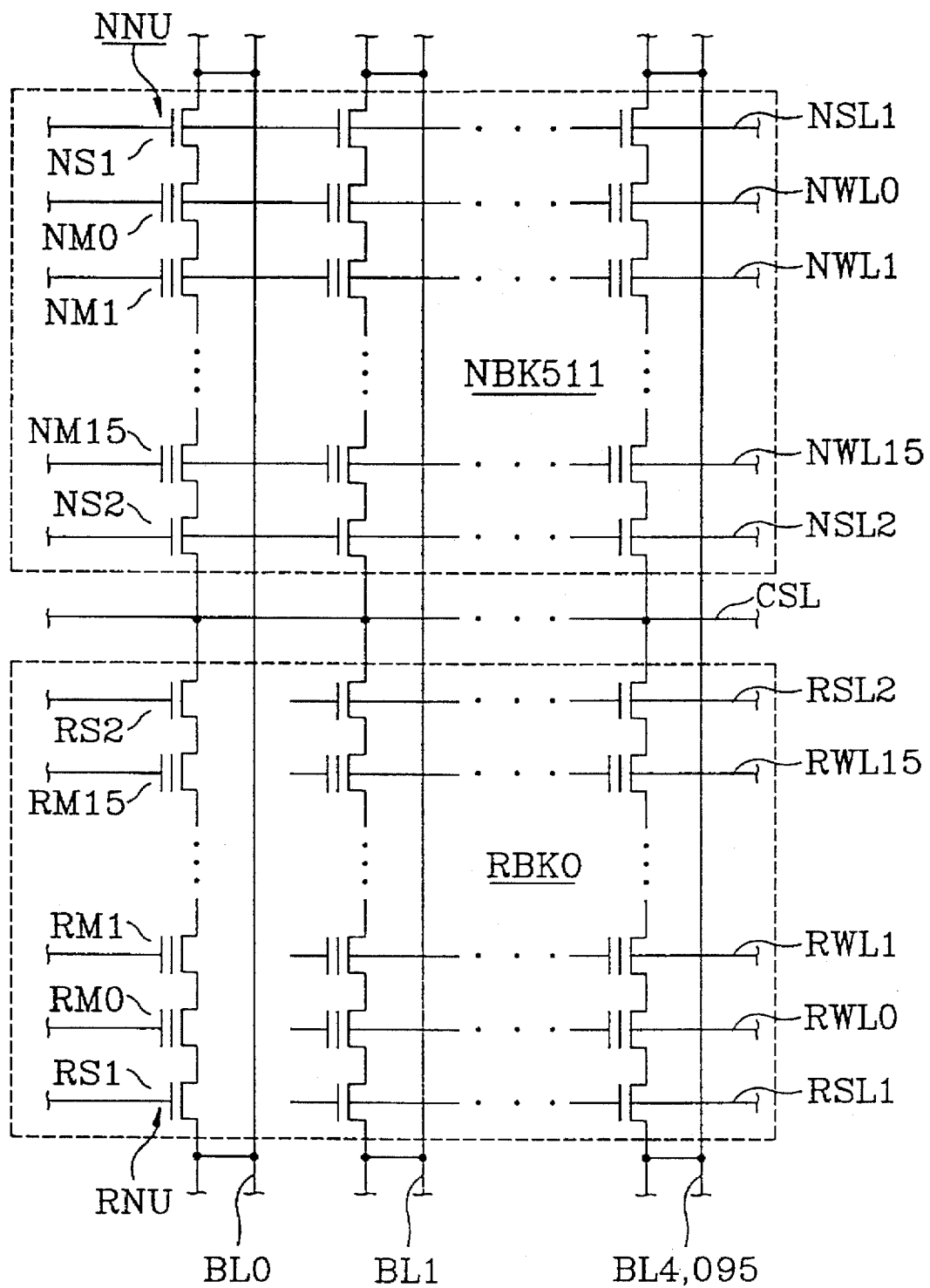
FIG. 2 is a schematic circuit diagram illustrating a portion of the memory cell array of FIG. 1.

FIG. 2 is an equivalent circuit diagram illustrating a portion of the memory cell array 10. For the convenience of illustration, only the memory cell array associated with a normal row block NBK511 of the normal memory cell array 12 and a redundant row block RBK0 of the redundant normal memory cell array 14 is illustrated. In FIG. 2, 4,096 bit lines BL0~BL4095 extend in parallel with column. To each of the bit lines BL0~BL4095 are connected normal NAND cell units NNU and redundant NAND cell units RNU.

Each normal cell unit NNU consists of a first normal selection transistor NS1, normal memory transistors NM0~NM15 and a second normal selection transistor NS2, all of whose drain-source paths are connected in series with one another. Drains of the first normal selection transistors NS1 in the same row are respectively connected to bit lines BL0~BL4095, and sources of the second normal selection transistors NS2 in the same row are connected in common to a common source line CSL. Gates of first normal selection transistors NS1, control gates of normal memory transistors NM0~NM15 and gates of second normal selection transistors NS2 which are arranged in rows within each normal row block are respectively connected to a first normal selection line NSL1, normal word lines NWL0~NWL15 and a second normal selection line NSL2.

Similarly, each redundant NAND cell unit RNU consists of a first redundant selection transistor RS1, redundant memory transistors RM0~RM15 and a second redundant selection transistor RS2 all of whose drain-source paths are connected in series with one another. Drains of the first redundant selection transistors RS1 in the same row are respectively connected to bit lines BL0~BL4095, and sources of the second redundant selection transistors RS2 in the same row are connected in common to the common source line CSL. Gates of first redundant selection transistors RS1, control gates of redundant memory cells RM0~RM15 and gates of second selection transistors RS2 which are arranged in rows of each redundant row block are respectively connected to a first redundant selection line RSL1, redundant word lines RWL0~RWL15 and a second redundant selection line RSL2.

Thus, the normal memory cell array 12 has 32 megabits of normal memory cells arranged in a matrix form of 8,192 rows and 4,096 columns, and the redundant memory cell array 14 has 524,288 bits of redundant memory cells in a matrix form of 128 rows and 4,096 columns. It should be noted that the present invention is not limited to such a capacity of normal and redundant memory cells.

In the device of FIG. 1, the redundant memory cell array 14 includes a first redundant memory cell array 16 under the control of a laser program and a second redundant memory cell array 18 under the control of an electrical program. The first redundant memory cell array 16 includes four redundant row blocks RBK0~RBK3, and the second redundant memory cell array 18 includes four redundant row blocks RBK4~RBK7.

A normal row decoder 20 responds to block selection address signals A13~A21 from an address buffer 24 to select one of the normal row blocks NBK0~NBK511, and responds to word line selection address signals A9~A12 therefrom in accordance with a selected one of the various modes of operation, such as read, write, and verify, to provide a predetermined voltage corresponding to the selected mode to a selected one of 16 normal word lines NWL0~NWL15 within the selected normal row block.

A redundant row decoder 22 includes first and second redundant row decoders which respond to redundant block selection address signals RR0~RR7 from first and second redundant address latch circuits 26 and 28, respectively, to select at least one of redundant row blocks RBK0~RBK7, and which respond to word line selection address signals A9~A12 from address buffer 24 according to a selected one of the various modes of operation, to provide a predetermined voltage corresponding to the selected mode to a selected one of 16 redundant word lines RWL0~RWL15 within the selected redundant row block. Such a row decoder is disclosed in U.S. patent application Ser. No. 08/441,177. A page buffer and sense amplifiers which are connected to the 4,096 bit lines, the column selection circuit and the data input/output buffer are disclosed in Korean Patent Application No. 94-35016, filed on Dec. 19, 1994 and assigned to the present assignee.

A control buffer 30 responds to external chip enable signal $\overline{CEx}$, external read enable signal $\overline{REx}$, external write enable signal $\overline{WEx}$, external address latch enable signal ALEx and external command latch enable signal CLEx and converts them into internal chip control signals, such as chip enable signal $\overline{CE}$, read enable signal $\overline{RE}$, write enable signal $\overline{WE}$, address latch enable signal ALE and command latch enable signal CLE.

Address buffer 24 latches external address signals PA0~PA21 from data I/O terminals I/O0~I/O7 at every toggle, i.e., high-going or low-going transition, of signal $\overline{WE}$, when the $\overline{CE}$ signal is in an enable state with a "L" level, i.e., a ground level, the $\overline{RE}$ signal is in a disable state with an "H" level, i.e., a power supply voltage Vcc level, the CLE signal is in a disable state with a "L" level, and the ALE signal in an enable state with an "H" level. Such an address buffer is disclosed in the above mentioned Korean Patent Application No. 94-35016.

Command register 32 is a conventional circuit which latches command signals from data I/O terminals I/O0~I/O7 in response to toggles of the $\overline{WE}$ signal when $\overline{CE}$ and ALE signals are at "L" levels, and $\overline{RE}$ and CLE signals are at "H" levels. The command register 32 receives a redundant array selection command, such as a B5 of hex code, through the data I/O terminals I/O0~I/O7, and produces a redundant array selection flag Sred during a redundant array selection mode of the command receiving operation, according to one of the features of the present invention.

A redundant predecoder 34 is enabled by the redundant array selection flag Sred from the command register 32 during the redundant array selection mode in order to check whether redundant memory cells are defective. Therefore, redundant predecoder 34 produces redundant row block selection signals $\overline{RED}_{bk0}$~$\overline{RED}_{bk7}$ which select a specified redundant row block, in response to block selection address signals A13~A15 and their complements $\overline{A13}$~$\overline{A15}$ from address buffer 24, and redundant row block overlap selection prevention signals $\overline{LF}_d$ and $\overline{RR}_{d4}$~$\overline{RR}_{d6}$ from redundant address overlap selection prevention circuit 36, as will be mentioned hereinbelow. The redundant predecoder 34 also serves to select a specified one of the redundant row blocks in response to the signals $\overline{LF}_d$ and $\overline{RR}_{d4}$~$\overline{RR}_{d6}$ during read and write operations.

Figure 3:
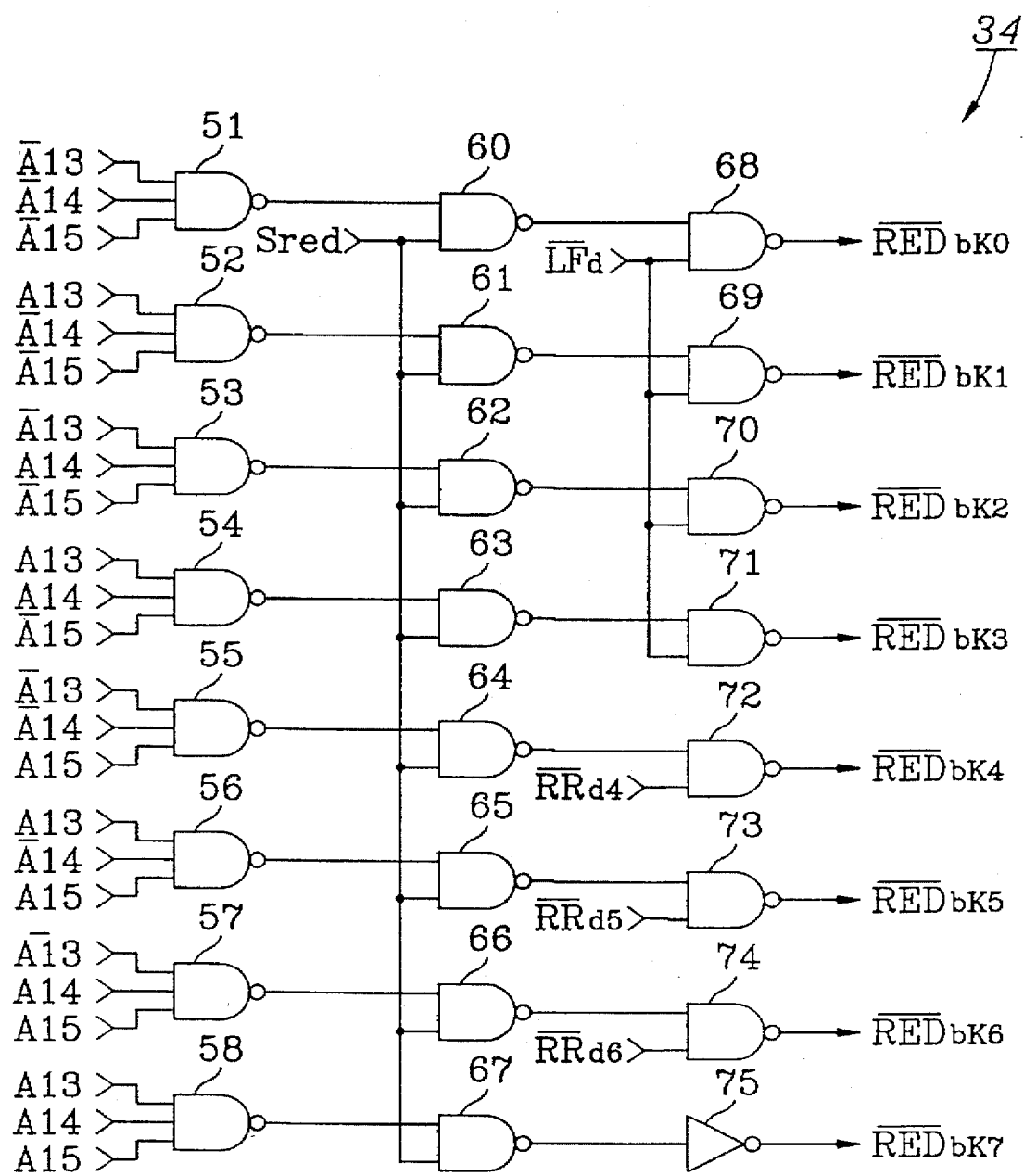
FIG. 3 is a schematic circuit diagram illustrating the redundant predecoder of FIG. 1.

FIG. 3 is a schematic circuit diagram illustrating the redundant predecoder. As shown in FIG. 3, the redundant predecoder 34 is comprised of NAND gates 51~74 and an inverter 75. Each of the NAND gates 51~58 receives the combination of row block selection signals A13~A15 and their complement signals $\overline{A13}$~$\overline{A15}$. Each of the NAND gates 60~67 inputs the output of a corresponding one of the NAND gates 51~58 and the redundant array selection flag Sred. Thus, during the redundant array selection operation, the NAND gates 60~67 are enabled by the Sred signal staying at an "H" level, and thereby one of the NAND gates 60~67 outputs an "H" level in response to the row block selection signals. The Sred signal stays at a "L" level during the remaining modes of operation except for the redundant array selection mode, and thereby the NAND gates 60~67 are disabled, outputting "H" level. First input terminals of NAND gates 68~74 are respectively connected to outputs of the NAND gates 60~66, and inverter 75 inputs the output of the NAND gate 67. Each of the second input terminals of NAND gates 68~71 inputs the redundant row block overlap selection prevention signal $\overline{LF}_d$ in order to disable redundant row block selection signals RR0~RR3 from the first redundant address latch circuit 26 to go to "L" levels, as will be discussed hereinbelow. Second input terminals of NAND gates 72~74 input the signals $\overline{RR}_{d4}$~$\overline{RR}_{d6}$, respectively. Thus, NAND gates 68~78 and inverter 75 allow one of the redundant block selection signals $\overline{RED}_{bk0}$~$\overline{RED}_{bk7}$ to go to a "L" level such that malfunction is prevented by doubly addressing or multiply programming into first and second redundant address latch circuits 26 and 28 during read and write operations, as will be disclosed hereinbelow.

Returning now to FIG. 1, the first redundant address latch circuit 26 stores redundant addresses corresponding to each of the defective normal row blocks having defective normal memory cells by laser programming during a redundant address program mode. The first redundant address latch circuit 26 may also select one of first redundant row blocks RBK0~RBK3, constituting the first redundant memory cell array, for comparison with the stored redundant address and the input address, i.e., redundant block selection signals $\overline{RED}_{bk0}$~$\overline{RED}_{bk3}$ from the redundant predecoder 34, during read and write operations. The first redundant address latch circuit 26 may also select one of the first redundant row blocks RBK0~RBK3 in response to redundant block selection signals $\overline{RED}_{bk0}$~$\overline{RED}_{bk3}$ from the redundant predecoder 34 during the redundant array selection mode of operation.

Figure 4:
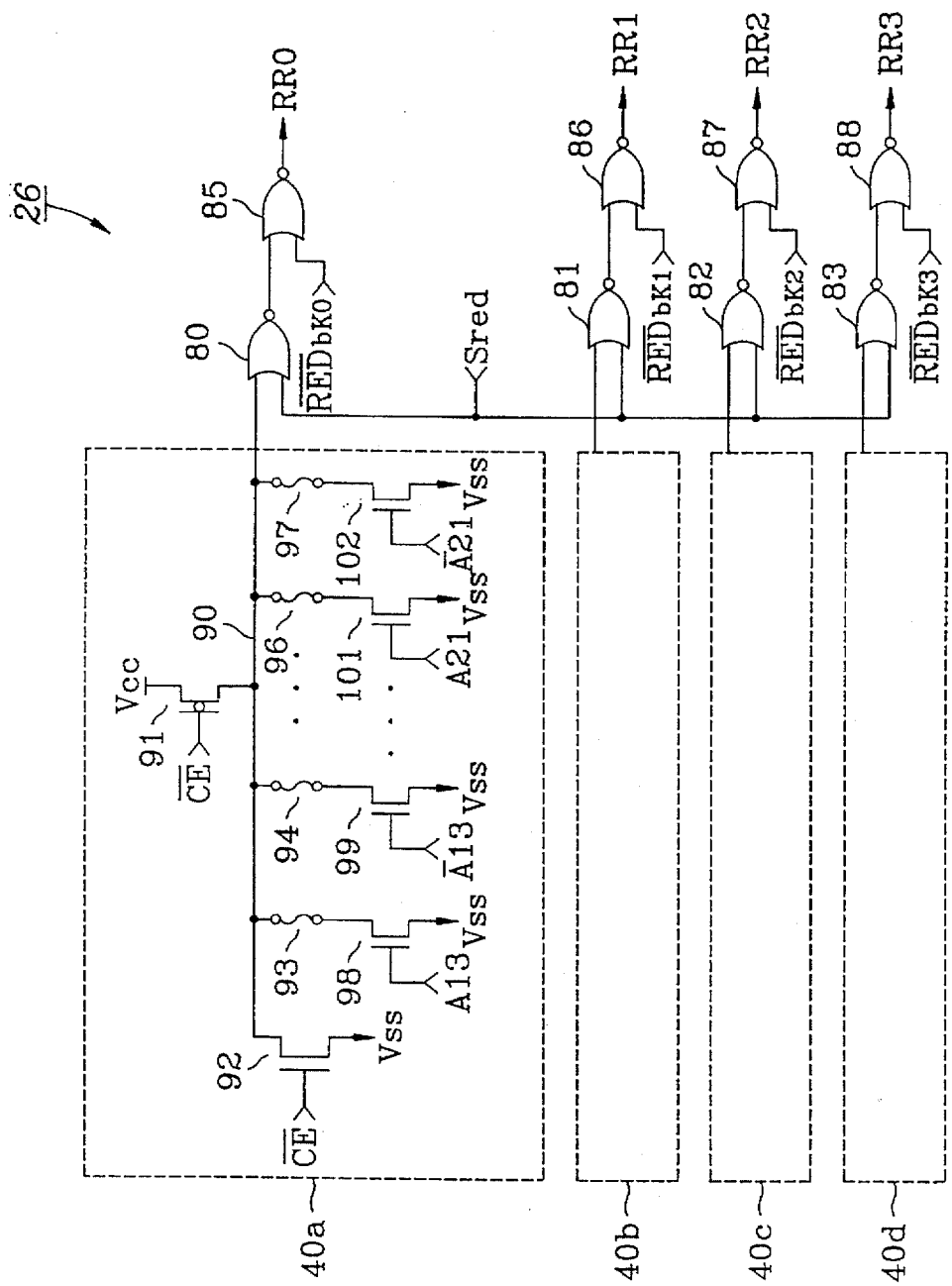
FIG. 4 is a schematic circuit diagram illustrating the first redundant address latch circuit of FIG. 1.

In FIG. 4, a schematic circuit diagram of the first redundant address latch circuit 26 is illustrated. The first redundant address latch circuit 26 includes laser program circuits 40a~40d for storing redundant addresses by laser programming and by NOR gates 80~88. For the convenience of illustration, although a schematic circuit diagram for a single laser program circuit 40a is illustrated, it should be noted that each of the remaining laser program circuits 40b~40d has a similar circuit diagram as that of the laser program circuit 40a.

Each of the laser program circuits 40a~40d includes a P-channel transistor 91, N-channel transistors 92 and 98~102 and fuses 93~97 formed of polysilicon. The drain-source path of P-channel transistor 91 is connected between the power supply voltage Vcc, for example 3.3 volts, and a line 90, and the gate of the transistor 91 is connected to the chip enable signal $\overline{CE}$. The drain of N-channel transistor 92 and one end of each fuse 93~97 is connected to the line 90, and the source of the transistor 92 is grounded to the reference potential Vss. The other end of each of the fuses 93~97 is connected to a corresponding drain of one of the N-channel transistors 98~102. The sources of N-channel transistors 98~102 are connected to the reference potential Vss. The gate of N-channel transistor 92 is connected to the chip enable signal $\overline{CE}$, and the gates of N-channel transistors 98 to 102 are respectively connected to block selection address signals A13 to A21 and their complement signals $\overline{A13}$~$\overline{A21}$. Lines 90 from laser program circuits 40a~40d are respectively connected to the first input terminals of NOR gates 80~83, the second input terminals of which are connected to the redundant array selection flag Sred from the command register 32. The first input terminals of NOR gates 85~88 are respectively connected to the output terminals of NOR gates 80~83, and the second input terminals of NOR gates 85~88 are respectively connected to redundant block selection signals $\overline{RED}_{bk0}$~$\overline{RED}_{bk3}$ from the redundant predecoder 34.

The storage of redundant addresses into laser program circuits 40a~40d is performed as follows. A test is performed to determine whether or not normal memory cells are defective in a wafer state. If a block selection address corresponding to defective normal memory cells is specified, the laser program is performed therewith. If one of the bits of the specified block selection address is at a "L" level, the fuse which is connected in series to the N-channel transistor and inputting its complement address bit is blown by the laser beam. If a bit of the specified block selection address is at a "H" level, the fuse which is connected in series to the N-channel transistor and inputting its address bit is blown by the laser beam.

For example, assuming that memory cells associated with a first normal row block NBK0 are found to be defective, block selection address signals A13~A21 specifying the normal row block NBK0 are all at "L" levels. Assume also that as a result of testing the redundant memory cells in a redundant array selection mode of operation, memory cells of the first redundant row block are found to be defective and that memory cells of the remaining redundant row blocks are defect-free. Then, no fuse cutting is performed for the laser program circuit 40a which is associated with the redundant row block selection signal RR0 selecting the first redundant row block RBK0. If substitution of the second redundant row block RBK1 for the defective normal row block NBK0 is desired instead, fuses 94 and 97 associated with the complement address signals $\overline{A}_{13}$~$\overline{A}_{21}$ within the laser program circuit 40b are blown.

The second input terminals of NOR gates 80~83 input the redundant array selection flag Sred, thereby being disabled to "L" levels in the redundant array selection mode. Thus, NOR gates 85~88 respond to redundant block selection signals $\overline{RED}_{bk0}$~$\overline{RED}_{bk3}$ from the redundant predecoder 34 and then output first redundant row block selection signals RR0~RR3. In read and write operations, NOR gates 80~83 respond to stored address within laser program circuits 40a~40d by the flag Sred staying at a "L" level, and NOR gates 85~88 respond to outputs of the NOR gates 80~83 and the signals $\overline{RED}_{bk0}$~$\overline{RED}_{bk3}$ and then output a selected one of the redundant row block selection signals RR0~RR3 to an "H" level, thereby enabling a redundant row block associated with the selected redundant row block selection signal. The NOR gates 85~88 are also disabled in response to the signals $\overline{RED}_{bk0}$~$\overline{RED}_{bk3}$ which are disabled to "H" levels by the signal $\overline{LF}_d$, and thereby the signals RR0~RR3 go to "L" levels. Then, redundant row blocks RBK0~RBK3 are not selected.

Returning now to FIG. 1, the second redundant address latch circuit 28 is programmed by way of electrical programming in a packaged state during a redundant program mode of operation, and serves to cause one of second redundant row blocks RBK4~RBK7, constituting the second redundant memory cell array 18 to be selected during read and write operations. The second redundant address latch circuit 28 may also cause one of the second redundant row blocks RBK4~RBK7 to be selected in response to the redundant block selection signals $\overline{RED}_{bk4}$~$\overline{RED}_{bk7}$ from the redundant predecoder 34 during the redundant array selection mode of operation.

Figure 5:
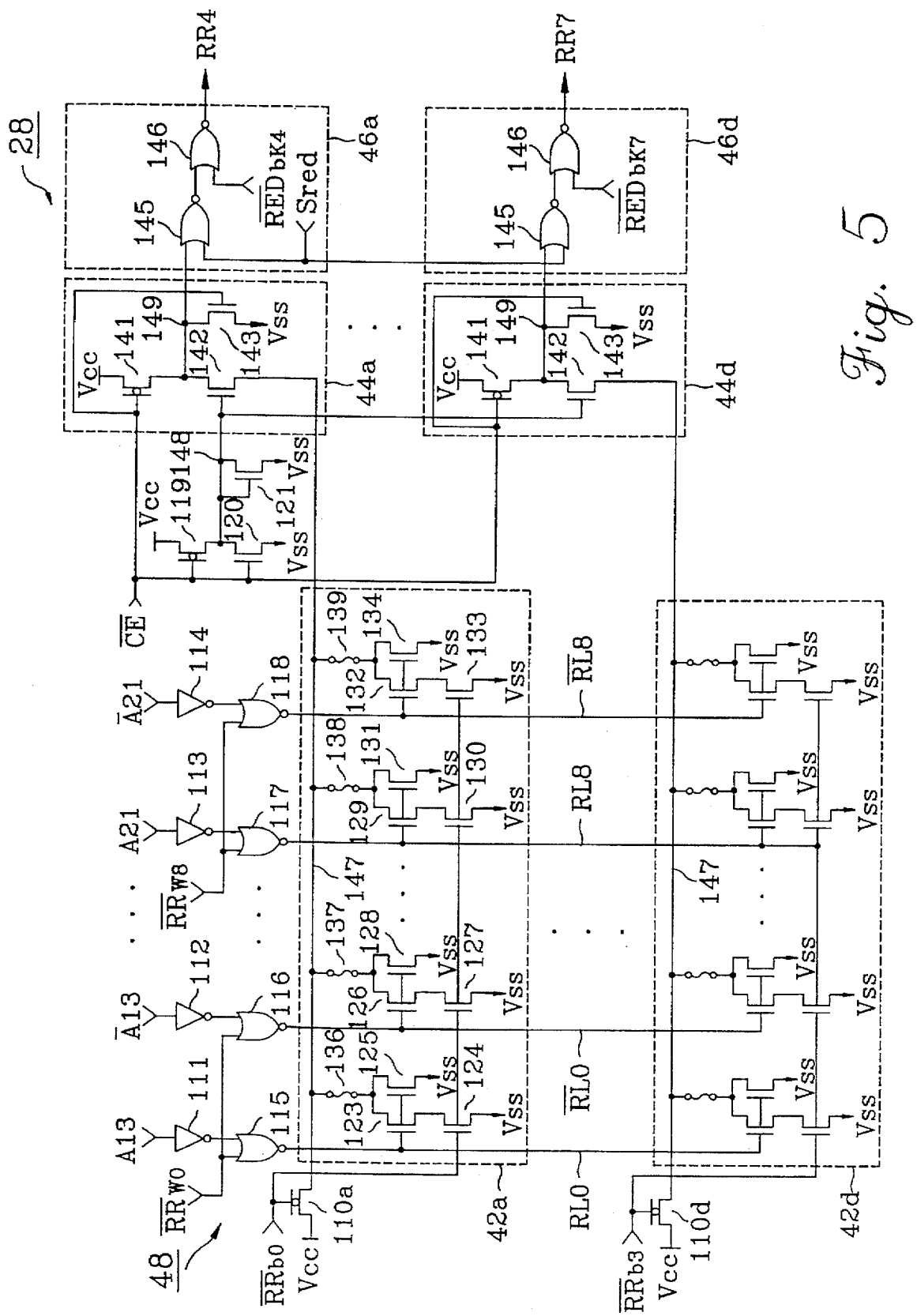
FIG. 5 is a schematic circuit diagram illustrating the second redundant address latch circuit of FIG. 1.

In FIG. 5, a schematic circuit diagram of the second redundant address latch circuit 28 is illustrated. The second redundant address latch circuit 28 includes electrical program circuits 42a–42d for storing normal row block selection address corresponding to defective normal memory cells during the redundant address program operation, sensing circuits 44a–44d respectively connected to the electrical program circuits 42a–42d for sensing the stored normal row block selection address, second redundant row block selection circuits 46a–46d respectively connected to the sensing circuits 44a–44d for selecting one of the second redundant row blocks in various operating modes, such as redundant array selection, read, write and redundant address overlap selection prevention modes of operation, and a control circuit 48 for controlling the sensing circuits 44a–44d and program aiming at the electrical program circuits 42a–42d.

The control circuit 48 includes P-channel transistors 110a~110d and 119, N-channel transistors 120 and 121, NOR gates 115~118 and inverters 111~114. The sources of P-channel transistors 110a~110d are connected to the power supply voltage Vcc or a voltage higher than Vcc, and the drains of the transistors 110a~110d are respectively connected to lines 147. The gates of the transistors 110a~110d are respectively connected to first fuse selection signals $\overline{RR}_{b0}$~$\overline{RR}_{b3}$. Inverter pairs 111, 112; . . . ; 113, 114 are respectively connected to pairs of each block selection address signal and its complement $A_{13}/\overline{A}_{13}$; . . . ;$A_{21}/\overline{A}_{21}$. The first input terminals of NOR gate pairs 115, 116; . . . ; 117, 118 are respectively connected to second fuse selection signals $\overline{RR}_{w0}$~$\overline{RR}_{w8}$. The second input terminals of NOR gates 115~118 are respectively connected to outputs of the inverters 111~114. The output terminals of the NOR gates 115~118 are respectively connected to lines RL0/$\overline{RL0}$~RL8/$\overline{RL8}$. The source-drain path of P-channel transistor 119 and the drain-source path of N-channel transistor 120 are connected in series between the power supply voltage Vcc and the reference potential Vss, and the gates of the transistors 119 and 120 are connected to the chip enable signal $\overline{CE}$. The connecting node 148 of the transistors 119 and 120 is connected to the drain and gate of N-channel transistor 121 whose source is connected to the reference potential Vss.

Each electrical program circuit 42a~42d includes N-channel transistors 123~134 and fuses 136~139 formed of polysilicon. One end of each of the fuses 136~139 within each electrical program circuit is connected to the line 147. The drain-source paths of each of the transistor pairs 123, 124; 126, 127; . . . ; 129, 130; 132, 133 are connected in series between the other end of each fuse 136~139 and reference potential Vss. The drains of N-channel transistors 125, 128, 131 and 134 are respectively connected to the other ends of fuses 136~139, and their sources are connected to the reference potential Vss. The gates of N-channel transistors 124, 127, 130 and 133 within each electrical program circuit are connected in common to a corresponding one of the first fuse selection signals $\overline{RR}_{b0}$~$\overline{RR}_{b3}$, and the gates of N-channel transistors 123, 125, 126, 128, 129, 131, 132 and 134 are respectively connected to lines RL0/$\overline{RL0}$~RL8/$\overline{RL8}$.

Each sensing circuit 44a~44d includes a P-channel transistor 141 and N-channel transistors 142 and 143. The source-drain path of P-channel transistor 141 and the drain-source path of N-channel transistor 142 within each sensing circuit are connected in series between the power supply voltage Vcc and the line 147. The drain-source path of N-channel transistor 143 is connected between the connecting node 149 of P-channel transistor 141 and N-channel transistor 142 and the reference potential Vss. The gates of the transistors 141 and 143 are connected to the chip enable signal $\overline{CE}$. The gate of the transistor 142 is connected to the connecting node 148.

Each second redundant row block selection circuit 46a~46d includes NOR gates 145 and 146. Two input terminals of NOR gate 145 of each second redundant row block selection circuit are respectively connected to the connecting node 149 and the redundant array selection flag Sred. Two input terminals of the NOR gate 146 thereof are respectively connected to the output of NOR gate 145 and a corresponding one of redundant block selection signals $\overline{RED}_{bk4}$~$\overline{RED}_{bk7}$.

Technology for storing normal row block address specifying defective normal memory cells into electrical program circuits 42a~42d is disclosed in Korean Patent Application No. 94-7549, filed on Apr. 11, 1994 and assigned to the same assignee. As briefly explained, the redundant address program operation is started after completion of packaging. It is now assumed that due to defects detected in normal memory cells within the first normal row block NBK0, a normal row block address specifying the first normal row block NBK0 is stored into the electrical program circuit 42a within the second redundant address latch circuit 28. The address buffer 24 latches external address signals (for example, PA0="L" and PA1="L") specifying the first fuse selection signal $\overline{RR}_{b0}$ to a "L" level, external address signals (for example, PA3=PA4=PA5=PA6="L") specifying the second fuse selection signal $\overline{RR}_{w0}$ to a "L" level, and external address signals (for example, PA13~PA21="L") specifying the first normal row block.

In response to the input of the second redundant address program command, $\overline{RR}_{b0}$ signal goes to the "L" level, and $\overline{RR}_{b1}$~$\overline{RR}_{b3}$ signals maintain "H" levels. At the same time, $\overline{RR}_{w0}$ signal goes to the "L" level, and $\overline{RR}_{w1}$~$\overline{RR}_{w8}$ signals maintain "H" levels. Thus, the P-channel transistor 110a is turned on, and thereby the power supply voltage Vcc is supplied to node 147 within the electrical program circuit 42a. NOR gates 115 and 116 are also enabled, and the remaining NOR gates are disabled to "L" levels. Since the address signal A13 is the "L" level and the complement signal $\overline{A13}$ is the "H" level, the line RL0 goes to a "L" level and the line $\overline{RL0}$ goes to an "H" level. Thus, the transistor 128 within the electrical program circuit 42a is turned on, and thereby the fuse 137 is blown. Thereafter, when only the external address signals specifying second fuse selection signals $\overline{RR}_{w1}$~$\overline{RR}_{w8}$ are changed in sequence, fuses associated with $\overline{A}_{14}$~$\overline{A}_{21}$ signals within the circuit 42a are likewise blown in sequence.

Thereafter, in read and write operations, the first fuse selection signals $\overline{RR}_{b0}$~$\overline{RR}_{b3}$ go to "H" levels, and the second fuse selection signals $\overline{RR}_{w0}$~$\overline{RR}_{w8}$ go to "L" levels. In response to an input of address signals selecting the first normal row block, since fuses 137 and 139 of the electrical program circuit 42a associated with $\overline{A13}$~$\overline{A21}$ signals were blown, and transistors connected to lines RL0~RL8 are turned off, node 147 within the circuit 42a is in a floating state. Thus, connecting node 149 within the sensing circuit 44a goes to an "H" level in response to $\overline{CE}$ signal being at the "L" level, so that the NOR gate 145 of the second redundant row block selection circuit 46a outputs a "L" level. Thus, the output of NOR gate 146, i.e., the second redundant row block selection signal RR4, goes to an "H" level. On the other hand, lines 147 of electrical program circuits 42b~42d with no fusing go to "L" levels, and then connecting nodes 149 of sensing circuits 44b~44d go to "L" levels. Consequently, second redundant row block selection signals RR5~RR7 remain at "L" levels. Thus, the second redundant row block RBK4 is selected. On the other hand, Sred signal stays at the "H" level in the redundant array selection mode, and thereby NOR gates 145 are disabled to "L" levels. Thus, second redundant row block selection signals RR4~RR7 may be specified by redundant block selection signals $\overline{RED}_{bk4}$~$\overline{RED}_{bk7}$.

As shown in FIG. 1, the redundant address overlap selection prevention circuit 36 responds to second redundant row block selection signals RR4~RR7 to produce redundant row block overlap selection prevention signals $\overline{LF}_d$ and $\overline{RR}_{d4}$~$\overline{RR}_{d6}$. After the replacement of at least one defective normal row block into a redundant row block with an address specifying the defective normal row block, when due to a defect in the replaced row block, the replacement of the redundant row block into another redundant row block is again made with the specifying address, the circuit 36 serves to select the latter redundant row block without selecting the former and latter redundant row blocks at the same time with the same specifying address. That is, when replacement has occurred as above twice with the same specifying address, the circuit 36 serves to select the finally replaced redundant row block without malfunction.

Figure 6:
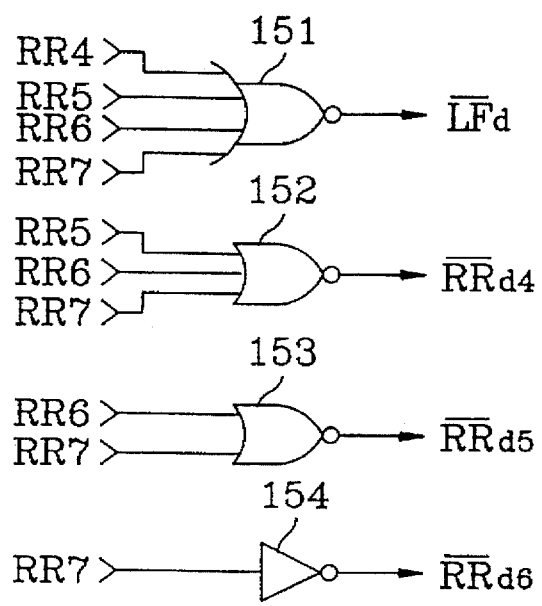
FIG. 6 is a schematic circuit diagram illustrating the redundant address overlap selection prevention circuit of FIG. 1.

In FIG. 6, a schematic circuit diagram of the redundant address overlap selection prevention circuit 36 is illustrated.

In the drawing, a NOR gate 151 receives second redundant row block selection signals RR4~RR7 and then outputs the redundant row block overlap selection prevention signal $\overline{LF}_d$. Similarly, NOR gates 152 and 153 receive RR5~RR7 signals and RR6~RR7 signals, respectively, and then output redundant row block overlap selection prevention signals $\overline{RR}_{d4}$ and $\overline{RR}_{d5}$, respectively. An inverter 154 inputs the RR7 signal and then outputs the $\overline{RR}_{d6}$ signal. Thus, when one of RR4~RR7 signals is selected, i.e., has a "H" level, the $\overline{LF}_d$ signal goes to a "L" level. Further, redundant block selection signals $\overline{RED}_{bk0}$~$\overline{RED}_{bk3}$ of FIG. 3 go to "H" levels, thereby unselecting first redundant row blocks RBK0~RBK3. For example, if RR6 signal is selected, i.e., redundant row block RBK6 is selected, signals $\overline{LF}_d$, $\overline{RR}_{d4}$ and $\overline{RR}_{d5}$ go to "L" levels, thereby unselecting redundant row blocks RBK0~RBK5.

Returning again to FIG. 1, the normal row decoder disable circuit 38 serves to disable the normal row decoder 20 upon selection of the redundant array and redundant row block during read and write operations.

Figure 7:
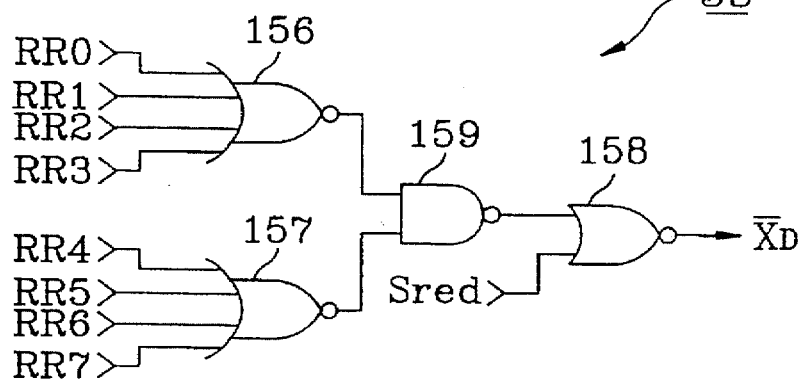
FIG. 7 is a schematic circuit diagram illustrating the row decoder disable circuit of FIG. 1.

In FIG. 7, a schematic circuit diagram of the normal row decoder disable circuit 38 is illustrated. In the drawing, NOR gates 156 and 157 input first and second redundant row block selection signals RR0~RR3 and RR4~RR7, respectively. NAND gate 159 inputs the outputs of NOR gates 156 and 157. The NOR gate 158 inputs the output of the NAND gate 159 and the signal Sred. Thus, during the redundant array selection operation, since the signal Sred is at the "H" level, a normal row decoder disable signal $\overline{X}_D$ goes to a "L" level, and thereby the normal row decoder 20 is disabled. If any one of the redundant row block selection signals RR0~RR7 is selected during read/write operations, the signal $\overline{X}_D$ goes to the "L" level, and then the normal row decoder 20 is disabled.

Various operations of the preferred embodiment of the present invention will now be explained in detail with reference to the accompanying drawings.

Redundant Array Selection Operation

Figure 8:
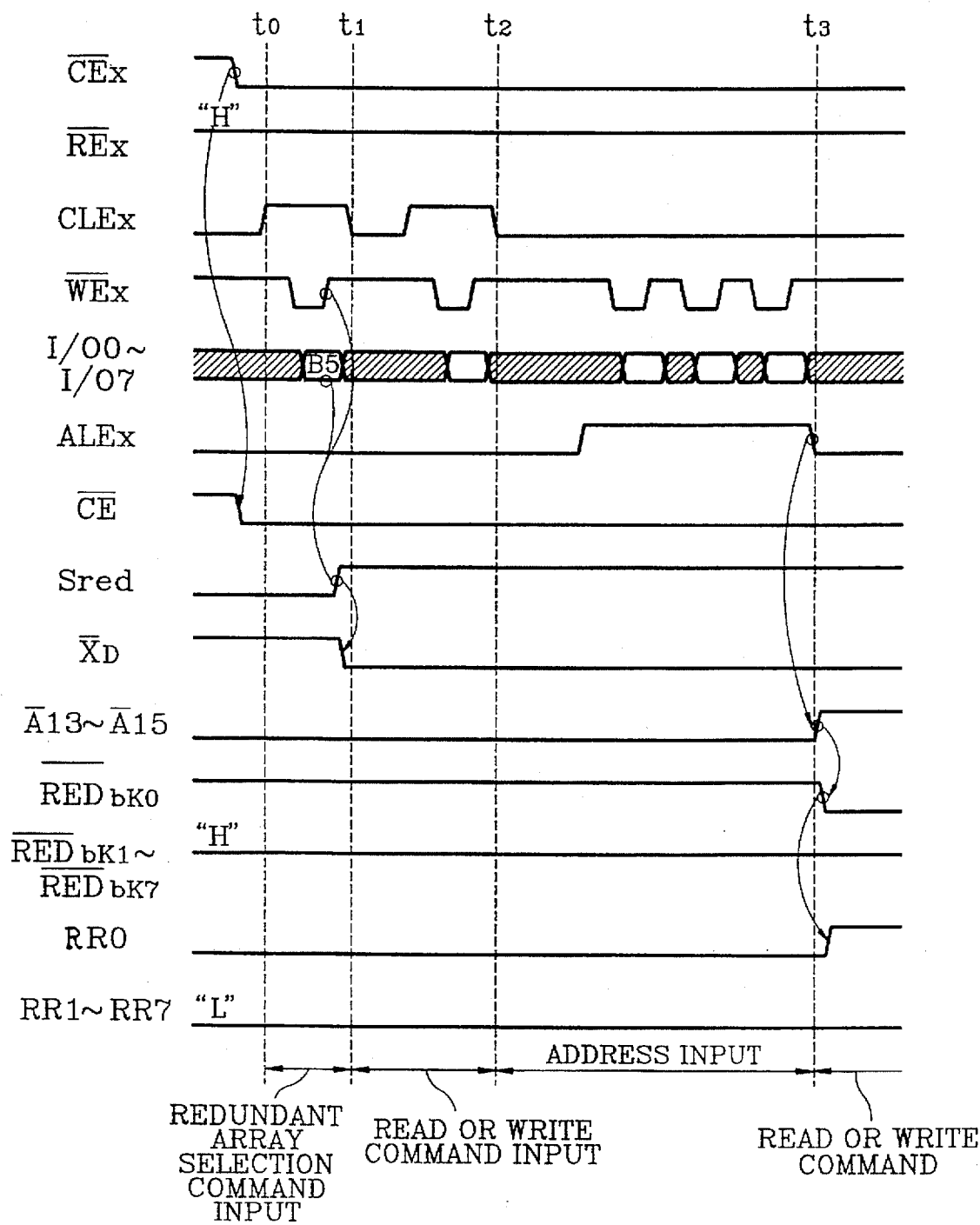
FIG. 8 is a timing diagram of various signals illustrating a redundant array selection operation according to the preferred embodiment of the present invention.

FIG. 8 is a drawing illustrating timing relationships of various signals in connection with the redundant array selection operation. To perform the redundant array selection operation, commands are input, as can be seen at the time period between the time $t_0$ and $t_2$ of FIG. 8. The redundant array selection command is input between the time $t_0$ and $t_1$, and the write or read command is input between $t_1$ and $t_2$.

Input of the command is performed by the transition of the external command latch enable signal $CLE_X$ from the "L" level to "H" level after the chip is enabled by the "L" level transition of the external chip enable signal $\overline{CE}_X$. Under this condition, reception of redundant array selection command is accomplished by receiving the redundant array selection command, such as, for example, B5 (hex code), through data I/O terminals I/O0~I/O7 after transition of the external write enable signal $\overline{WE}_X$ from the "H" level to "L" level. The redundant array selection command is latched to the command register 32 by the transition of $\overline{WE}_X$ signal to an "H" level, and then the command register 32 produces the redundant array selection flag Sred going to an "H" level. Then, the row decoder disable circuit 38 produces the normal row decoder disable signal $\overline{X}_D$ causing the normal row decoder 20 to be disabled in response to the flag Sred. Thereafter, the read or write command is input.

Input of the read or write command is accomplished by receiving the read command, such as 00 or 01 (hex code), or the write command, such as 80 (hex code), through the data I/O terminals I/O0~I/O7 after the transition of $\overline{WE}_X$ signal from the "H" level to the "L" level under the "H" level $CLE_X$ signal, as explained above. The command register 32 latches the write or read command in response to the transition of $\overline{WE}_X$ signal to an "H" level, and then outputs the write or read command signal.

After the input of a read or write command, input of an address is performed between the time $t_2$ and $t_3$. The address input operation is disclosed in Korea Patent Application Nos. 94-25243 and 94-35016, both assigned to the present assignee and incorporated herein by reference. Under the condition where the external address latch enable signal $ALE_X$ stays at an "H" level, external address signals PA0~PA7 are input through data I/O terminals I/O0~I/O7 after the first "L" level transition of $\overline{WE}_X$ signal, external address signals PA8~PA15 are input through data I/O terminals I/O0~I/O7 after the second "L" level transition of $\overline{WE}_X$ signal, and external address signals PA16~PA21 are input through data I/O terminals I/O0~I/O7 after the third "L" level transition of $\overline{WE}_X$ signal. The external address signals are latched to the address buffer 24 in response to first through third address latch enable signals $\overline{ALE}_1$~$\overline{ALE}_3$ which are generated each time the $\overline{WE}_X$ signal transits to a "L" level. The address buffer 24 outputs address signals A0~A21 corresponding to the latched address signals PA0~PA21 and their complement signals $\overline{A0}$~$\overline{A21}$ in response to the "L" level transition of ALEx signal. Address signals A13~A15 and their complement signals $\overline{A13}$~$\overline{A15}$ are used for selecting redundant row blocks RBK0~RBK7.

It is now assumed that the external address specifying a redundant row block RBK0 is input. Then, the external address signals PA13~PA15 (="L") specifying the redundant row block RBK0 are input through I/O0~I/O7 terminals, and then the address buffer 24 outputs A13~A15 (="L") ($\overline{A13}$~$\overline{A15}$="H") at time $t_3$ of FIG. 8 in response to the "L" level transition of ALEx signal. The redundant predecoder 34 responds to "H" level-going signals $\overline{A13}$~$\overline{A15}$ with the initial state of the signals Sred, $\overline{LF}_d$ and $\overline{RR}_{d4}$~$\overline{RR}_{d6}$ which are all "H" levels. Thus, the NAND gate 51 of FIG. 3 outputs a "L" level and NAND gates 52~58 output "H" levels. Consequently, the redundant block selection signal $\overline{REDbk0}$, i.e., the output of NAND gate 68, goes to a "L" level, and redundant block selection signals $\overline{RED}_{bk1}$~$\overline{RED}_{bk7}$, i.e., outputs of NAND gates 69~74 and inverter 75, remain at "H" levels. Thus, since NOR gates 80~83 and 145 constituting first and second redundant address latch circuits 26 and 28, as illustrated in FIGS. 4 and 5, respectively, go to "L" levels with the "H" level staying Sred signal, the NOR gate 85 responds to the "L" level-going $\overline{RED}_{bk0}$ signals, thereby allowing the redundant row block selection signal RR0 to go to an "H" level. The remaining NOR gates 86~88 and 146 output "L" levels with the signals $\overline{RED}_{bk1}$~$\overline{RED}_{bk7}$ which are staying at "H" levels. Thus, redundant row block RBK0 is unselected, and redundant row blocks RBK1~RBK7 are selected.

However, the normal row decoder disable circuit 38 of FIG. 7 outputs the signal $\overline{X}_D$ going to a "L" level in response to the signal RR0 going to "H" level, thereby unselecting the normal memory cell array 12. Thus, circuit portions comprised of the redundant predecoder 34 and NOR gates 80~88, 145 and 146 provide a redundant row block selection circuit or means for selecting one of redundant row blocks in response to the signal Sred and the external address. The operation after the time $t_3$ of FIG. 8 performs the write or read operation depending on a given command, i.e., either a write or read command, between the time $t_1$ and $t_2$. The read and write operations are disclosed in Korean Patent Laid-open No. 94-18870 and Korean Patent Application No. 94-35016. Since the read and write operations are not a feature of the present invention, detailed explanation thereof will be omitted.

The redundant array selection operation according to the present invention may read and write only for the redundant cell array, and thereby the presence or absence of defects in the redundant cell array may be determined by the test. Thus, it has an advantage of reduced testing and repairing times for redundant memory cells.

Redundant Row Block Overlap Selection Prevention Operation

Figure 9:
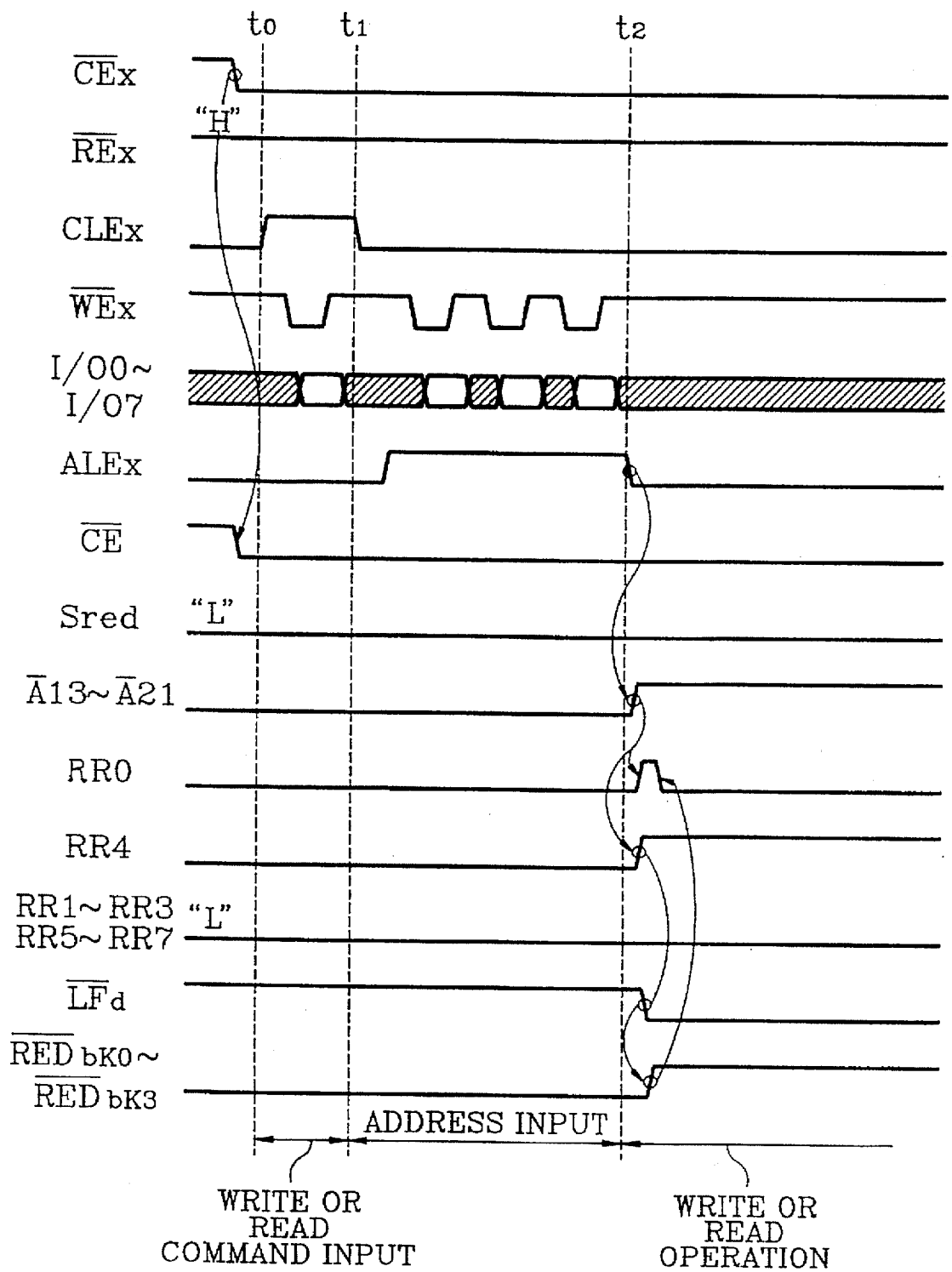
FIG. 9 is a timing diagram of various signals illustrating a redundant row block overlap selection prevention operation according to the preferred embodiment of the present invention.

It is now assumed that an address specifying the normal row block NBK0 is to be stored into the laser program circuit 40a of the first redundant address latch circuit 26 such that the normal row block NBK0 is replaced into the redundant row block RBK0 within the first redundant memory cell array 16 due to the defect of memory cells associated with the normal row block NBK0 within the normal memory cell array 12. Thereafter, due to defects in the redundant memory cells of the redundant row block RBK0, it is further assumed that the redundant row block RBK0 is to be replaced into a redundant row block RBK4 within the second redundant memory cell array 18, and the address specifying the normal row block NBK0 is to be stored into the electrical program circuit 42a within the second redundant address latch circuit 28. FIG. 9 is a timing diagram of various signals in this case. The explanation has been already made of the ways of programming or storing an address specifying the defective normal row block into the laser program circuit and electrical program circuit.

As shown in FIG. 9, the write or read command is input between the time $t_0$ and $t_1$ in the same manner as discussed above after the chip enable state of $\overline{CE}_X$ signal with the "L" level. Thereafter, between the time $t_1$ and $t_2$, external address signals are input in the same manner as discussed above. It is assumed that the input address specifies the normal row block NBK0. Then, the address buffer 24 outputs block selection address signals $\overline{A13}$~$\overline{A21}$ going to "H" levels in response to ALEx signal going to the "L" level at time $t_2$ (A13~A21 signals are at "L" levels). The laser program circuit 40a within the first redundant address latch circuit 26 of FIG. 4 outputs the "H" level in response to the address signals, as discussed above. Since the signals Sred and $\overline{RED}_{bk1}$~$\overline{RED}_{bk7}$ are at "L" levels in the initial state, the first redundant row block selection signal RR0 goes to the "H" level. However, the remaining laser program circuits 40b~40d output "L" levels, and thereby the remaining first redundant row block selection signals RR1~RR3 remain at "L" levels. The normal row decoder disable circuit 38 of FIG. 7 outputs $\overline{X}_D$ signal of the "L" level in response to the signal RR0 going to the "H" level, thereby unselecting the normal memory cell array 12. At the same time, the electrical program circuit 42a of the second redundant address latch circuit 28 of FIG. 5 outputs the "H" level in response to the address signals A13~A21 (="L" levels) and $\overline{A13}$~$\overline{A21}$ (="H" levels), and thereby the second redundant row block selection signal RR4 goes to "H" level.

On the other hand, the electrical program circuits 42b~42d keep the second redundant row block selection signals RR5~RR7 at "L" levels in response to the address signals. Then, the NOR gate 151 of the redundant address overlap selection prevention circuit 36 of FIG. 6 outputs the $\overline{LF}_d$ signal going to the "L" level in response to the signal RR4 going to the "H" level, and the remaining NOR gates 152 and 153 and the inverter 154 produce $\overline{RR}_{d4}$~$\overline{RR}_{d6}$ signals maintaining "H" levels in response to RR5~RR7 signals staying at "L" levels. Thus, NAND gates 68 and 71 of the redundant predecoder 34 of FIG. 3 produce "H" levels, thereby causing the RR0~RR3 signals, i.e. the output signals of NOR gates 85~88 of FIG. 4, to be disabled to "L" levels such that the first redundant memory cell array 16 is unselected. Thus, the signal RR0 selecting the first redundant row block RBK0 goes to the "L" level, thereby unselecting the block RBK0. At the same time, NAND gates 64~67 and 72~74 and the inverter 75 of FIG. 3 output the signals $\overline{RED}_{bk4}$~$\overline{RED}_{bk7}$ maintaining "L" levels in response to the signal $\overline{RR}_{d4}$~$\overline{RR}_{d6}$ staying at "H" levels and the signal Sred being at the "L" level, and thereby the signal RR4 and the signals RR5~RR7 maintain the "H" level and "L" levels, respectively. Thus, the redundant row block RBK4 associated with the reprogrammed electrical program circuit 42a is selected.

In the operation after time $t_2$ of FIG. 9, the write or read operation is performed according to a given command between $t_0$ and $t_1$, as discussed above.

It is now assumed that a redundant memory cell of the redundant row block RBK4 was again defective and thereby the address specifying the normal row block NBK0 was programmed into the electrical program circuit 42b associated with the redundant row block RBK5. Then, in response to the address signals A13~A21 (="L" levels) and $\overline{A13}$~$\overline{A21}$ (="H" levels), the first redundant address latch circuit 26 of FIG. 4 produces the signal RR0 going to the "H" level and the second redundant address latch circuit 28 of FIG. 5 produces the signals RR4 and RR5 going to "H" levels.

Then, the redundant address overlap selection prevention circuit 36 of FIG. 6 outputs the signals $\overline{LF}_d$ and $\overline{RR}_{d4}$ going to "L" levels, and thereby the redundant predecoder 34 makes the signals $\overline{RED}_{bk0}$~$\overline{RED}_{bk4}$ go to "H" levels. Thus, the signals RR0 and RR4 go from "H" levels to "L" levels, thereby unselecting the normal row block NBK0 and the redundant row block RBK4. However, since the signal RR5 maintains "H" level, the redundant row block RBK5 is selected. Thus, each time a memory cell associated with the using redundant row block is defective, one of the remaining redundant row blocks may be replaced in turn without malfunction by reprogramming the electrical program circuit associated therewith into the specified address. Thus, the redundant address overlap selection prevention circuit 36 of FIG. 6 and NAND gates 68~74 of FIG. 3 provide means for preventing overlap selection of redundant row blocks, i.e., an overlap selection inhibiting circuit.

Although the present invention was explained in connection with the first and second redundant address latch circuits respectively using laser programming, which replaces defective cells in a wafer state, and electrical programming, which replaces in a packaged state, it should be noted that the present invention is not limited to those techniques. All of the first and second redundant address latch circuits may be applied by electrical programming. In this case, the circuit of FIG. 4 is replaced into the circuit of FIG. 5. That is, the first and second redundant address latch circuits 26 and 28 are unified into a single redundant address latch circuit using electrical programming, and the redundant row block selection signals RR0~RR7 are changed so as to be output from the unified redundant address latch circuit. Then, the redundant row blocks associated with the signals RR0~RR3 may be replaced in a wafer state. The redundant row blocks associated with the signal RR0~RR7 may also be replaced in a packaged state.

As discussed above, the present invention may reduce testing time and enhance chip performance since defective normal memory cell or cells as well as defective redundant memory cell or cells may be replaced without malfunction by the manufacturer and users.

Although the present invention has been described in detail with reference to the preferred embodiments thereof, it will be appreciated by those skilled in the art that various modifications and substitutions can be made thereto without departing from the spirit and scope of the invention as set forth in the appended claims.

What is claimed is:

1. A nonvolatile semiconductor memory comprising:
   a normal memory cell array having a plurality of normal row blocks;
   a redundant memory cell array having a plurality of redundant row blocks;
   a normal row decoder which selects one of said normal row blocks;
   a redundant row decoder connected to said redundant row blocks;
   a redundant address latch circuit connected to said redundant row decoder which is programmed with an address specifying a defective normal row block so as to substitute a first redundant row block for said defective normal row block, and when said first redundant row block is defective, said redundant address latch circuit is reprogrammed with said address so as to substitute a second redundant row block for said first redundant row block;
   a normal row decoder disable circuit which disables said normal row decoder when said defective normal row block is selected; and
   an overlap selection inhibiting circuit which prevents selection of said first redundant row block when said defective normal row block is selected such that said redundant row decoder instead selects said second redundant row block.

2. A nonvolatile semiconductor memory according to claim 1, wherein said normal and redundant memory cell arrays include a plurality of memory cells arranged in rows and columns, said normal and redundant row blocks comprising a number of said rows.

3. A nonvolatile semiconductor memory comprising:
   a normal memory cell array having a plurality of normal row blocks;
   a redundant memory cell array having a plurality of redundant row blocks;
   a normal row decoder which selects one of said normal row blocks;
   first and second redundant row decoders which select one of said first redundant row blocks and one of said second redundant row blocks, respectively;
   a first redundant address latch circuit which is programmed with an address specifying a defective normal row block such that said first redundant row decoder selects one of said first redundant row blocks in response to said specified address;
   a second redundant address latch circuit which is programmed with said specified address such that said second redundant row decoder selects one of said second redundant row blocks in response to said specified address;
   a normal row decoder disable circuit which disables said normal row decoder when said defective normal row block is selected; and an overlap selection inhibiting circuit which prevents selection of said one of said first redundant row blocks such that said second redundant row decoder selects said one of said second redundant row blocks in response to said specified address.

4. A nonvolatile semiconductor memory according to claim 3, wherein said normal and redundant memory cell arrays include a plurality of memory cells arranged in rows and columns, said normal and redundant row blocks comprising a number of said rows.

5. A nonvolatile semiconductor memory according to claim 3, wherein said first redundant address latch circuit is programmed in a wafer state, and said second redundant address latch circuit is programmed in a packaged state of said nonvolatile semiconductor memory.

6. A nonvolatile semiconductor memory according to claim 3, wherein said first and second redundant address latch circuits are programmed in a packaged state.

7. A method of replacing a defective normal row block in a nonvolatile semiconductor memory, comprising the steps of:

programming an address specifying said defective normal row block such that a first redundant row block is substituted for said defective normal row block;

re-programming said address when said first redundant row block fails such that a second redundant row block is substituted for said first redundant row block; and inhibiting selection of said first redundant row block and enabling selection of said second redundant row block when said defective normal row block is selected.

8. A method according to claim 7, further comprising the steps of:

receiving a redundant array selection command and said address;

preventing the selection of said defective normal row block in response to said array selection command;

selecting said second redundant row block in response to said redundant array selection command and said address.

* * * * *